(12) United States Patent
Yamagata et al.

(10) Patent No.: US 6,507,105 B1
(45) Date of Patent: *Jan. 14, 2003

(54) MEMBER FOR SEMICONDUCTOR DEVICE AND METHOD FOR PRODUCING THE SAME

(75) Inventors: Shin-ichi Yamagata, Itami (JP); Osamu Suwata, Itami (JP); Chihiro Kawai, Itami (JP); Akira Fukui, Itami (JP); Yoshinobu Takeda, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/498,338

(22) Filed: Feb. 4, 2000

Related U.S. Application Data

(62) Division of application No. 09/256,783, filed on Feb. 24, 1999.

(30) Foreign Application Priority Data

Feb. 24, 1998 (JP) .............................................. 10-41447
Feb. 5, 1999 (JP) .............................................. 11-28940

(51) Int. Cl.[7] .............................................. H01L 29/12
(52) U.S. Cl. ...................................... 257/720; 257/706
(58) Field of Search .............................. 257/613, 631, 257/633, 635, 706, 712, 717, 720

(56) References Cited

U.S. PATENT DOCUMENTS 3,178,807 A   4/1965 Bergmann (List continued on next page.)

FOREIGN PATENT DOCUMENTS

| EP | 0 237 047 | 3/1987 |
|---|---|---|
| EP | 0 813 243 | 12/1997 |
| FR | 2-667 615 | 10/1991 |
| JP | 61-222668 | 10/1986 |
| JP | 1-501489 | 5/1989 |
| JP | 2-243729 | 9/1990 |
| JP | 9-157773 | 6/1997 |
| JP | 10-280082 | 10/1998 |
| JP | 10-335538 | 12/1998 |
| WO | 91/13462 | 9/1991 |

OTHER PUBLICATIONS

"Metal Matrix Composite Packaging of Microwave Circuitry", by Jeffries et al., GEC Journal of Research, vol. 11, No. 3, 1994, pp. 150–166.

"Metal Matrix Comosite Power Modules: Improvements in Reliability and Package Integration", by Romero et al., Record of the Industry Applications Conference, Oct. 8–12, 1995, vol. 1, No. CONF. 30, pp. 916–922.

"A Review of Substrate Materials for Power Hybrid Circuits", by Fuchs et al, International Journal of Microcircutis and Electronic Packaging, vol. 20, No. 1, Apr. 1, 1997, pp. 61–66.

*Primary Examiner*—Olik Chaudhuri
*Assistant Examiner*—Wai-Sing Louie
(74) *Attorney, Agent, or Firm*—McDermott, Will & Emery

(57) ABSTRACT

A member for semiconductor devices comprising a composite alloy of aluminum or an aluminum alloy and silicon carbide, wherein silicon carbide grains are dispersed in aluminum or the aluminum alloy in an amount of from 10 to 70% by weight, the amount of nitrogen in the surface of the member is larger than that in the inside thereof, and the ratio of aluminum or the aluminum alloy to silicon carbide is the same in the surface and the inside. The member is produced by mixing powdery materials of aluminum or an aluminum alloy and silicon carbide, compacting the mixed powder, and sintering the compact in a non-oxidizing atmosphere containing nitrogen gas, at a temperature between 600° C. and the melting point of aluminum. The member is lightweight and has high thermal conductivity as well as thermal expansion coefficient which is well matches with that of ceramics and others. Therefore, the member is especially favorable to high-power devices.

6 Claims, 1 Drawing Sheet

U.S. PATENT DOCUMENTS

| | | | |
|---|---|---|---|
| 4,828,008 A | * 5/1989 | White et al. | ................ 164/66.1 |
| 5,006,417 A | 4/1991 | Jackson et al. | |
| 5,384,087 A | 1/1995 | Scorey | |
| 5,532,513 A | 7/1996 | Smith et al. | |
| 5,616,421 A | 4/1997 | Sawtell et al. | |
| 5,775,403 A | 7/1998 | Premkumar et al. | |
| 5,780,164 A | 7/1998 | Pyzik et al. | |
| 5,886,407 A | * 3/1999 | Polese et al. | ................ 257/706 |
| 5,902,943 A | 5/1999 | Schaffer et al. | |
| 6,183,874 B1 | * 2/2001 | Yamagata et al. | .......... 428/472 |
| 6,245,442 B1 | * 6/2001 | Towata et al. | .............. 428/614 |

* cited by examiner

MEMBER FOR SEMICONDUCTOR DEVICE AND METHOD FOR PRODUCING THE SAME

This application a Divisional of application Ser. No. 09/256,783 filed Feb. 24, 1999.

BACKGROUND OF THE INVENTION

1. Field of the Invention

The present invention relates to a member for semiconductor devices comprising an aluminum-silicon carbide-based composite alloy, to a method for producing it, and to a semiconductor device comprising the member.

2. Description of the Prior Art

The recent market demand for high-speed operation, large-scale integration semiconductor devices is greatly increasing. Therefore, the market has required much more increase in the thermal conductivity of heat-radiating substrates to be mounted with semiconductor chips, for the purpose of more efficiently removing the heat as generated by semiconductor chips. The market has further required the heat-radiating substrates to have a thermal expansion coefficient that is much nearer to that of the other members to be disposed adjacent to them, for the purpose of minimizing the thermal strain between the substrates and the adjacent members. The thermal expansion coefficient of silicon (hereinafter referred to as Si) and gallium arsenide (hereinafter referred to GaAs) that are generally used for semiconductor chips is $4.2 \times 10^{-6}/°C$. and $6.5 \times 10^{-6}/°C$., respectively. The thermal expansion coefficient of alumina ceramics that are generally used for outer frame members for semiconductor devices is around $6.5 \times 10^{-6}/°C$. Therefore, it is desired that the thermal expansion coefficient of the substrates is near to those values.

With the recent increasing expansion of the application area of electronic appliances, the application area of semiconductor devices is being much more diversified. Above all, the same shall apply to the field of semiconductor power devices such as high-power AC conversion devices and frequency conversion devices. The quantity of heat from the semiconductor chips of those devices is from a few times to tens times that from semiconductor memories and microprocessors (in general, the former is, for example, tens W). Therefore, the requirements noted above for the heat-radiating substrates for those devices are extremely severe. Accordingly, the basic structure of the substrates may be, for example, as follows: First, Si semiconductor chips are mounted on a first heat-radiating substrate of an electricity-insulating aluminum nitride (hereinafter referred to as AlN in a simple manner) ceramic substrate with high thermal conductivity. Next, a second heat-radiating substrate with higher thermal conductivity of, for example, copper is disposed below the first heat-radiating substrate. Then, this is fitted to a water-cooling or air-cooling heat-radiating system. In that manner, therefore, the structure of the heat-radiating substrates is complicated. In this case, where an AlN ceramic having a thermal conductivity of around 170 W/m·K is used for the first heat-radiating substrate, the second heat-radiating substrate shall have a thermal conductivity of at least 200 W/m·K or more at room temperature, for efficient heat removal from the first substrate. In addition, in that case, the second heat-radiating substrate shall have a low thermal expansion coefficient of at most $10 \times 10^{-6}/°C$., especially at most $8 \times 10^{-6}/°C$., in order that its thermal expansion coefficient could be near to that of the AlN ceramic.

Especially in those of the power devices that generate a large quantity of heat in practical operation, the heat-radiating substrates themselves will often be heated at temperatures of 100° C. or higher. As the case may be, therefore, the heat-radiating substrates in them are often required to still have a high thermal conductivity of at least 150 W/m·K at such high temperatures. In addition, the increase in the operation capacity of power devices requires much more efficient heat radiation from them. In that case, the size of the heat-radiating substrates on which semiconductor chips are mounted shall be inevitably enlarged. In this connection, the size of the heat-radiating surface of substrates for personal computers is at most from 20 to 40 mm square or so. As compared with those, for example, the size of the same for some high-power devices with large operation capacity is often over 200 mm square. In such large-sized substrates, it is necessary that the dimension change to be caused by temperature elevation during packaging and practical operation is small. For instance, warp or deformation of substrates, if occurred, gives some gaps between the warped or deformed substrates and radiators or fins, thereby lowering the heat radiativity of the substrates. As the case may be, semiconductor chips mounted on the warped or deformed substrates will be broken. For these reasons, ensuring good thermal conductivity at high temperatures of heat-radiating substrates is one of important themes in the art.

For such substrates, for example, Cu—W-based or Cu—Mo-based composite alloys have heretofore been used. However, the cost of the substrates of those composite alloys is high, since the materials for them are expensive, and, in addition, they are heavy. Recently, therefore, various aluminum (hereinafter referred to as Al in a simple manner) composite alloys have been used for inexpensive and light-weight substrate materials. For example, as one type of those alloys, mentioned are Al—SiC-based composite alloys comprising Al and silicon carbide (hereinafter referred to as SiC in a simple manner) as main components. The materials for the composite alloys are relatively inexpensive, and the composite alloys themselves are lightweight and have high thermal conductivity. In this connection, the density of Al and SiC alone is around 2.7 g/cm$^3$ and around 3.2 g/cm$^3$, respectively, and the thermal conductivity thereof is around 240 W/m·K and around 270 W/m·K, respectively. The thermal expansion coefficient of SiC alone is around $3.5 \times 10^{-6}/°C$., and that of aluminum alone is $24 \times 10^{-6}/°C$. Therefore, the thermal expansion coefficient of the composite alloys comprising them could be controlled within a broad range, and the composite alloys are specifically noticed in the art.

Such Al—SiC-based composite alloys and methods for producing them are disclosed in (1) JP-W-1-501489, (2) JP-A-2-243729, (3) JP-A-61-222668, and (4) JP-A-9-157773. The method in (1) comprises melting Al in a mixture of SiC and Al followed by solidifying the mixture through casting. The method in (2) and (3) comprises infiltrating Al melt into the pores of porous SiC. Of those, the method in (3) is a so-called pressure infiltration method, in which the Al melt is infiltrated into the porous SiC under pressure. The method in (4) comprises disposing a compact or a hot-pressed body of SiC and Al in a mold followed by heating it in vacuum therein at a temperature not lower than the melting point of Al for sintering it in liquid phase.

We, the present inventors have previously proposed an Al—SiC-based composite alloy in JP-A-10-335538. This has a thermal conductivity of at least 100 W/m·K, and a thermal expansion coefficient of at most $20 \times 10^{-6}/°C$., and contains from 10 to 70% by weight of granular silicon carbide. This alloy is obtained according to a sintering method (which comprises preparing a mixed powder originally having the intended compositional ratio of Al—SiC, followed by sintering it). In one preferred embodiment of the alloy, aluminum carbide (hereinafter referred to as $Al_4C_3$ in a simple manner) is dispersed in the interface between Al and SiC. For producing the alloy, powdery materials of Al and SiC are mixed in the ratio noted above, and the resulting mixture is compacted, and then sintered in a non-oxidizing atmosphere (in general, in an atmosphere which contains at least 99% by volume of nitrogen gas and has an oxygen concentration of at most 200 ppm, and which has a dew point of not higher than −20° C.) at a temperature falling between 600 and 750° C. According to this method, obtained is the intended composite alloy having a thermal conductivity of at least 180 W/m·K. When the compact is sintered to give the alloy, it gives a liquid phase. Even if the liquid phase formed reaches 30% or more of the total, it flows out little. Therefore, the alloy thus produced could maintain the original shape of the compact.

In addition, the inventors have also proposed previously an Al—SiC-based composite alloy to be produced through liquid-phase sintering, in JP-A-10-280082. This alloy contains Al or an Al alloy in an amount of from 5 to 80% by weight, and is deformed little after sintered. Therefore, the dimension of the sintered alloy is nearly the intended dimension thereof, or that is, net-shape alloys are obtained therein. The production method for the alloy disclosed comprises forming a layer of a substance capable of inhibiting Al elution on at least one surface of the compact of the starting powder for the alloy, while forming a layer of a mixture of the substance with another substance that promotes Al melt infiltration on the remaining surface, followed by sintering the compact in an non-oxidizing atmosphere. In the production method, the dimension change in the outer periphery of the alloy produced is reduced, and Al elution from the entire surface of the sintered body of the alloy is almost completely prevented. According to the production method disclosed in the laid-open publication, obtained are Al—SiC-based composite alloys having a thermal expansion coefficient of at most $18×10^{-6}/°C$. and a thermal conductivity of at least 230 W/m·K.

However, using the alloys as obtained according to some methods mentioned above for substrates for semiconductor devices is problematic in the following points. First mentioned are the problems with the alloy as obtained according to the casting method of (1). While the compact for the alloy is cooled, the components of Al and SiC segregate therein due to the density difference between them, thereby resulting in that the composition of the alloy is often not uniform. In particular, it is inevitable that the surface of the alloy is covered with a layer of Al or an Al alloy (this is hereinafter referred to as a simple term of Al-coating layer). In general, the thickness of the Al-coating layer much varies. In addition, owing to the difference in the thermal expansion coefficient between the coating layer and the SiC-alloyed inside body, thermal stress is formed in the interface between them when heat is transferred to that interface. Therefore, if the alloy having the coating layer on its surface is directly used as a substrate, thermal stress is distributed over its surface area owing to the difference in thickness of the coating layer, thereby resulting in that the substrate is warped or deformed in the stage of packaging or in the stage of practical operation. As a result, cracks are often formed in the boundaries between the substrate and the semiconductor chips or other members mounted on it. For these reasons, therefore, the coating layer must be previously removed through machining, before the alloy is formed into substrates. However, for completely removing the coating layer from the entire surface of the alloy, the inside of the alloy where hard SiC grains are combined with soft Al to give a composite structure must also be removed in some degree, since the thickness of the coating layer varies in places. Therefore, working for the removal is difficult, and the increase in the working cost is inevitable.

On the other hand, in order to surely obtain densified alloys according to the melt infiltration method of (2) or (3) noted above, an excess amount of an Al melt-infiltrating agent must be disposed in contact with the compact. In that condition, however, Al not infiltrated into the compact deposits on the outer periphery of the compact (this may be referred to as Al elution), and time-consuming labor is needed for removing the Al deposit. In case of the method described in JP-A-10-335538 mentioned above, where the compact is sintered at a temperature higher than the melting point of Al, the same phenomenon as above also occurs in some degree.

In order to solve these problems, the method of JP-A-10-280082 mentioned above may be employed, by which the Al elution could be prevented. However, in order to remove the residue of the layer formed on the compact, considerable labor is needed. Therefore, it is desired to develop a means for preventing the formation of the Al-coating layer and for preventing the Al elution on the surface of the alloy. In addition, for promoting the spontaneous infiltration of Al, a sub-component of, for example, a metal of Groups 1a and 2a is often added to Al. However, the sub-component added lowers the thermal conductivity of the resulting alloy. For example, the thermal conductivity of the alloys as prepared with the sub-component being added thereto could be at most 170 W/m·K or so at 20° C. At temperatures of 100° C. or higher, those alloys will inevitably have a low thermal conductivity of lower than 150 W/m·K.

The pressure melt infiltration method of (3) comprises the following steps. First, a porous SiC compact is put in a monoaxially compressible mold, and Al or an Al alloy is put on it. The resulting set is monoaxially compressed by an external force in vacuum, with Al or the Al alloy being melted, whereby the Al melt is infiltrated under pressure into the pores of the SiC compact. Next, the thus Al-infiltrated body is gradually cooled at its bottom in a gradient temperature-profiled manner. In that condition, however, while Al is solidified, it is locally led into the deep inside of the body, thereby often giving spots with no Al infiltration thereinto (these correspond to shrinkage cavities in steel casting), since the difference in the thermal expansion coefficient between the SiC phase and the Al phase in the body is great. Therefore, the method requires a complicated fine control mechanism capable of accurately controlling both the cooling temperature profile and the pressure heating program. Accordingly, the apparatus for the method is extremely expensive. In addition, for promoting the spontaneous Al infiltration, a sub-component of, for example, a metal of Groups 1a and 2a is often added to Al. However, the sub-component added lowers the thermal conductivity of the resulting alloy. For example, the thermal conductivity of the alloys as prepared with the sub-component being added thereto could be at most 170 W/m·K or so at 20° C. At temperatures of 100° C. or higher, those alloys will inevitably have a low thermal conductivity of lower than 150 W/m·K.

The vacuum hot pressing method of (4) is problematic in the following points. When a continuous hot-pressing device is used for the method, the Al melt must be prevented from flowing out of the mold, since the compact is hot-pressed in vacuum at a temperature not lower than the melting point of Al. In order to surely prevent the Al melt from flowing out and to obtain a desired uniform composition, an extremely expensive apparatus is needed. On the other hand, when a batch-type hot-pressing device is used, the Al melt could be prevented from flowing out in some degree. However, the cycle of charging the compact into the mold and the controlled heating program must be intermittently repeated, and this lowers the producibility. In addition, for the same reasons as those mentioned above for the pressure melt infiltration method, it is difficult to stabilize the quality of the alloys produced. According to this method, alloys having a thermal expansion coefficient of at most $10 \times 10^{-6}/°C$. and a thermal conductivity of at least 200 W/m·K, both of which are indispensable for substrates, are not obtained.

SUMMARY OF THE INVENTION

The object of the invention is to solve the problems mentioned hereinabove, and to provide a substrate for semiconductor devices for practical application with high reliability.

The member for semiconductor devices, which the invention provides, comprises a composite alloy of aluminum or an aluminum alloy and silicon carbide. In the composite alloy, silicon carbide grains are dispersed in aluminum or the aluminum alloy in an amount of from 10 to 70% by weight, and the amount of nitrogen in the surface of the composite alloy is larger than that in the inside thereof. In this, the ratio of aluminum or the aluminum alloy to silicon carbide is the same in the surface and the inside. Where the member of the invention comprises an aluminum alloy, the alloy may contain at least one element selected from the group consisting of elements of Groups 4a, 5a, 6a, 7a, 8, 3b and 4b.

The member of the invention may have a surface roughness Ra of at most 2 μm. The member of the invention includes those containing silicon carbide grains dispersed therein in an amount of at least 60% by weight, and having a thermal expansion coefficient of at most $10 \times 10^{-6}/°C$. and a thermal conductivity of at least 200 W/m·K. In addition, it includes those having a thermal conductivity of at least 150 W/m·K at a temperature of 100° C. or higher.

The method for producing the member for semiconductor devices of the invention comprises a step of preparing a mixed powder by so blending powdery materials comprising, as main components, aluminum or an aluminum alloy and silicon carbide that the amount of silicon carbide in the mixed powder may be from 10 to 70% by weight of the total (step 1), a step of compacting the mixed powder into a compact (step 2), and a step of sintering the compact into a sintered body, in a non-oxidizing atmosphere containing at least 99% of nitrogen gas, at a temperature within a range falling between 600° C. and the melting point of aluminum (step 3).

The method for producing the member for semiconductor devices of the invention includes an embodiment in which the compacting pressure in the step 2 is at least 2 tons/cm². It also includes an embodiment in which the amount of oxygen in the atmosphere in the step 3 is at most 200 ppm, and an embodiment in which the dew point of the atmosphere is not higher than −20° C.

The invention further includes an embodiment in which the step 3 comprises sintering the compact into a sintered body, in a non-oxidizing atmosphere containing at least 99% of nitrogen gas, at a temperature within a range falling between 600° C. and the melting point of aluminum, then sealing up the resulting sintered body in a metal container into a sealed body, and subjecting the sealed body to pressure heat treatment at a temperature not lower than 700° C. In this, the sealing step includes an embodiment in which the metal container is degassed to have a vacuum of $5 \times 10^{-1}$ Torr or less, and then the compact is sealed up therein into a sealed body. This also includes an embodiment in which the pressure heat treatment of the sealed body is effected under a pressure of at least 100 atm. The invention still further includes an embodiment in which the step 3 comprises sintering the compact into a sintered body, in a non-oxidizing atmosphere containing at least 99% of nitrogen gas, at a temperature within a range falling between 600° C. and the melting point of aluminum, then pre-heating the resulting sintered body at a temperature not lower than 600° C., and subjecting it to pressure heat treatment (for forging) in a mold. In this, it is desirable that the pressure for the pressure heat treatment is at least 2 tons/cm².

The invention further includes a semiconductor device comprising the member mentioned above.

DETAILED DESCRIPTION OF THE PREFERRED EMBODIMENTS

Figure 1:
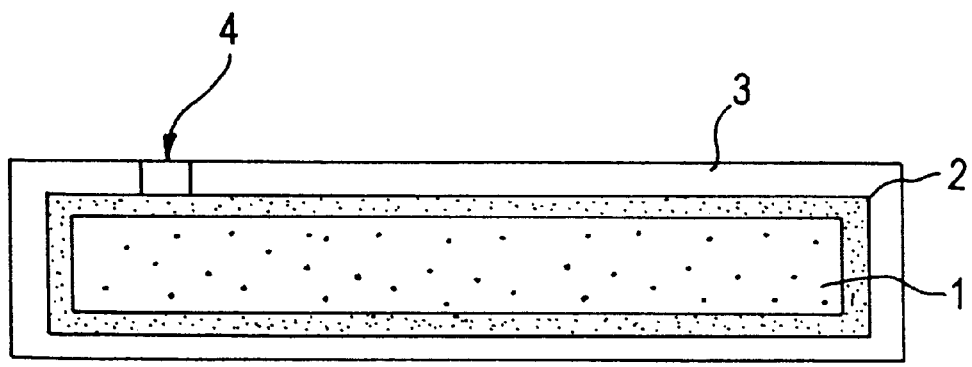
FIG. 1 is a graphic view that shows vacuum sealing of the sintered body of the invention in a metal container.

The member for semiconductor devices, which the invention provides, comprises a composite alloy of Al or an Al alloy and SiC having the characteristics noted above. Al has a high thermal conductivity of 240 W/m·K and a large thermal expansion coefficient of $24 \times 10^{-6}/°C$. On the other hand, SiC has a high thermal conductivity of 270 W/m·K, but has a small thermal expansion coefficient of $3.5 \times 10^{-6}/°C$. Accordingly, alloying Al and SiC in different ratios into composite alloys provides members having high thermal conductivity and having a thermal expansion coefficient that varies in a broad range.

The member of the invention contains from 10 to 70% by weight of SiC grains as uniformly dispersed in the matrix of Al or an Al alloy. If the amount of the SiC grains therein is smaller than 10% by weight, the member will have a large thermal expansion coefficient of larger than $20 \times 10^{-6}/°C$.; but if larger than 70% by weight, the compact for the member will be difficult to sinter, and the densified sintered body could not have been obtained. The amount of SiC to be dispersed is preferably at least 60% by weight. In the preferred condition, obtained are composite alloys for good practical application, which have a thermal expansion coefficient of at most $10 \times 10^{-6}/°C$. and a thermal conductivity of at least 200 W/m·K. The composite alloys are especially suitable to heat-radiating substrates for power devices. The composite alloys having such a large SiC content may have a high thermal conductivity of at least 150 W/m·K at 100° C. or higher.

The amount of nitrogen in the surface of the member of the invention is larger than that in the inside thereof. This is because of the following reasons. Just after having been sintered, Al in the surface of the composite alloy of the invention is nitrided. Since the sintered alloy of the invention has nearly a net shape, it may be worked only a little for finishing it. Therefore, the alloy may be directly used for practical members, not requiring any heavy working to a great extent for finishing (for example, in some heavy working, the surface of a sintered alloy is cut or machined at least to a level falling between hundreds μm and a few mm from the surface). Therefore, the nitrided surface remains in the alloy of the invention. The reason why the alloy surface is nitrided is as follows. Al is easy to oxidize. Therefore, before sintered, the surfaces of the Al grains in the compact are coated with an Al oxide. In the production method of the invention, the compact is sintered in a non-oxidizing atmosphere that contains nitrogen gas in an amount of at least 99%. In this case, nitrogen gas diffuses from the surface of the compact into its inside. Through the nitrogen gas diffusion, the oxide in the surfaces of the Al grains is nitrided essentially into aluminum oxynitride (AlON). The nitriding may occur even inside the compact, essentially starting from the starting points of the pores in the compact, but it is much promoted especially in the surface of the compact that is all the time contacted with nitrogen gas. Therefore, the nitrogen amount in the surface of the alloy shall be larger than that in the inside thereof.

To conventional Al—SiC-based composite alloys, in general, an alloying component for Al is added. The alloys are generally sintered at a temperature not lower than the melting point of Al. Therefore, while Al is melted therein, the alloying component in the alloys moves toward the surface of the alloys with Al elution thereon. As a result, the surface of the alloys shall have an Al-coating layer of Al or the Al-alloying component, and the component exists in the surface layer. For these reasons, the amount of SiC in the surface layer is smaller, relative to that in the inside. As opposed to those, however, the composite alloy of the invention is sintered at a temperature not higher than the melting point of Al. Therefore, the Al-alloying component segregate little in the surface of the member that comprises the composite alloy of the invention, not as in the conventional alloys. In the surface of the composite alloy of the invention, aluminum oxynitride is rather formed, as so mentioned hereinabove. In the invention, the sintered alloy may be finally subjected to pressure heat treatment at a temperature not lower than the melting point of Al. For the pressure heat treatment, however, the sintered alloy is sealed in a metal container or set in a closed mold. In any case, therefore, no Al melt bleeds out or moves toward the surface of the alloy. This phenomenon is promoted by the aluminum oxynitride layer existing in the surface of the sintered alloy. Therefore, even though the pressure heat treatment is effected at a temperature not lower than the melting point of Al, any Al-alloying component segregate little in the surface of the member comprising the alloy, not as in the conventional alloys. Accordingly, the members obtained in any production method of the invention have the same ratio of Al or an Al alloy to SiC anywhere in the surface and the inside thereof. As a result, it is believed that the entire composition of the alloy could be uniform. For these reasons, in the member of the invention, the presence of no composition difference produces almost no thermal stress. Therefore, the degree of thermal warping and deformation of the member of the invention can be reduced.

The member of the invention as produced in the manner mentioned above could retain the surface roughness of the compact, after having been sintered and subjected to pressure heat treatment. In order to retain the surface roughness after sintering, it is necessary that the inner surface of the metal container or the mold to be used for the pressure heat treatment and also the powder to be inserted in the container or the mold are controlled to have a small surface roughness and a small mean grain size, respectively. After having been processed in the manner mentioned above, the alloy may be finished in a simple manner to have a surface roughness Ra of generally at most 2 μm. As the case may be, the alloy may have Ra of 1.5 μm or smaller.

As so mentioned hereinabove, the method for producing the member of the invention comprises a step of preparing a mixed powder that comprises the main components (step 1), a step of compacting it into a compact (step 2), and a step of sintering the compact into a sintered body (step 3).

The reason why the amount of SiC to be in the alloy of the invention is defined to fall between 10 and 70% by weight has been mentioned hereinabove. For mixing the powdery materials to give the mixed powder, any ordinary means is employable. Preferably, for example, employed is a ball mill or the like in a wet method, for which an organic solvent such as ethyl alcohol or the like is used as the solvent for mixing, so as to prevent the oxidation of Al. It is desirable that the mixing medium (this corresponds to balls in ball mills) as well as the inner wall of the mixing container is made of, for example, SiC so as not to lower the thermal conductivity of the alloy to be produced. In order to facilitate the compacting operation in the next compacting step, it is desirable that an ordinary organic binder is additionally mixed with the powdery materials. The mechanical strength of the resultant compact from the mixed slurry thus containing an organic binder is enhanced, whereby the intended shape will be easily ensured in the finally obtained member. Since a suitable mechanical strength can be obtained, it is easy to prevent the compact from being cracked or scratched at its corners or surface while the compact is handled. In addition, it is also desirable that the mixed powder or slurry prepared after mixing is granulated to thereby reduce as much as possible its volume per the unit weight and to increase the powder fluidity in the next compacting step.

For compacting the mixed powder or its granules, any ordinary method is employable. For example, employable herein is any of various methods of dry powder pressing, isostatic pressing such as cold isostatic pressing (CIP), wet doctor blading, extrusion molding, injection molding and the like. For the dry powder pressing method and the isostatic pressing method, the compacting pressure is preferably at least 2 tons/cm$^2$. If the compacting pressure is lower than 2 tons/cm$^2$, the bonding of the Al powder and the SiC powder in the compact will be poor. In particular, the mechanical strength of the compact having a large SiC content will be often low, when compacted under such a low compacting pressure. In addition, the compact having been compacted under such a low compacting pressure will easily crack while it is handled for sintering. The compact for which an organic binder was mixed with the powder shall be heated, as the case may be, in a non-oxidizing atmosphere to remove the binder therefrom, prior to being sintered in the next step.

The compact is sintered in a non-oxidizing atmosphere that contains nitrogen gas in an amount of at least 99%, at a temperature falling between 600° C. and the melting point of aluminum. If the sintering temperature is lower than 600° C., the compact will be poorly sintered and could not be sufficiently alloyed to give a composite alloy. In addition, the thermal conductivity of the sintered body could not reach the intended level of at least 200 W/m·K. If, however, the sintering temperature is higher than the melting point of aluminum (generally, 660° C.), the thermal conductivity of the sintered body will be low and, in addition, the sintered body will be greatly warped or deformed. If so, unfavorably, the sintered body could not be a net-shaped alloy, and requires heavy finishing of, for example, cutting or machining. It is presumed that the sintering of the compact within the defined temperature range could give a sintered body having high thermal conductivity for the following reasons. Specifically, within the defined temperature range, the reaction area in the interface between the SiC grains and the Al grains is small. As a result, the amount of the reaction product $Al_4C_3$ in the interface shall be lower than a specific amount (in general, at most 5% by weight of the total weight of the sintered body). Accordingly, the thermal diffusion in the interface is increased in a suitable degree.

The amount of nitrogen gas in the non-oxidizing atmosphere shall be at least 99%. Its principal aim is to prevent the oxidation of Al so as not to lower the thermal conductivity of the alloy produced. Merely for preventing the Al oxidation, the sintering may be effected in vacuum or in hydrogen gas, or even in an inert gas such as argon, helium or the like. However, the method of the invention does not require such an expensive gas for the intended sintering. In the method of the invention, when the sintering is effected at a temperature around the melting point of aluminum and even when Al or the Al alloy begins to partly melt owing to the temperature change in the furnace, the molten Al or Al alloy is effectively prevented from flowing out in the surface of the sintered alloy. The reason for it has already been mentioned hereinabove. In the invention, the amount of oxygen in the sintering atmosphere is preferably at most 200 ppm. In that sintering atmosphere having an oxygen content of not larger than 200 ppm, the oxidation of Al could be more surely prevented, thereby facilitating the sintering operation. For the same reason, it is desirable that the dew point of the sintering atmosphere is not higher than −20° C.

Another method for producing the member of the invention comprises sealing up the sintered body having been prepared according to the process mentioned above, in a metal container into a sealed body, and subjecting the sealed body to pressure heat treatment at a temperature not lower than 700° C. Prior to sealing up the sintered body therein, in general, it is desirable that the metal container is degassed to have a vacuum of $5 \times 10^{-1}$ Torr or less. The pressure for the next pressure heat treatment is desirably at least 100 atm. The treatment is generally effected in obtaining alloys having an SiC content of at least 60% by weight or in obtaining large-sized bodies. The reason is that, in the case of such sintered bodies, sintering will not be sufficiently proceeded under the sintering conditions noted above, and a long-time sintering will be required for densification. As a result, it is difficult to stably obtain large-sized sintered bodies having a thermal conductivity of at least 200 W/m·K. The treatment much promotes the thermal diffusion in the interface between Al and SiC. As a result, members having a high thermal conductivity of at least 150 W/m·K even at 100° C. or higher could be obtained in a stable and easy manner.

In any production method for producing the member of the invention where an Al alloy is used as the matrix component, it is desirable that the amount of the subcomponent in the Al alloy used is at most 2% by weight. Adding a component, such as Mg, Cu or the like, that may form a solid solution with Al will often lower the thermal conductivity of the composite alloy, and, therefore, it is desirable to evade as much as possible the addition of that component. For example, components containing any element of Groups 1a, 2a, 1b and 2b are undesirable. Elements of Group 1a include Li, Na, K, Rb, Cs and Fr; those of Group 2a include Be, Mg, Ca, Sr, Ba and Ra; those of Group 1b include Cu, Ag and Au; and those of Group 2b include Zn, Cd and Hg. For improving the hardness and the chemical corrosion resistance of the matrix component, any other metal element may be dispersed in Al. For this, preferred are components containing at least one element selected from the group consisting of elements of Groups 4a, 5a, 6a, 7a, 8, 3b and 4b. Elements of Group 4a include Ti, Zr and Hf; those of Group 5a include V, Nb and Ta; those of Group 6a include Cr, Mo and W; those of Group 7a include Mn, Tc and Re; those of Group 8 include Fe, Co, Ni, Ru, Rh, Pd, Os, Ir and Pt; those of Group 3b include B, Ga, In and Tl; and those of Group 4b include C, Si, Ge, Sn, and Pb.

In general, the pressure heat treatment may be attained by treating the sealed body through hot isostatic pressing (hereinafter referred to as HIP) at 700° C. or higher. The material for the metal container in which the sintered body is sealed up shall be so selected that the container is resistant to temperatures of 700° C. or higher and does not react with Al melt, that the heat-treated body could be easily separated (released) from the container after heat-treating, and that the container could be uniformly deformed. For example, for the container, preferably used are iron-based materials such as stainless steel, mild steel and the like, as well as copper, copper alloys, etc. In order to improve the releasability of the heat-treated body from the metal container, it is desirable to put, for example, a ceramic sheet, cloth or powder consisting essentially of carbon, alumina and boron nitride, as the releasing material, between the container and the sintered body. For inserting the releasing material therebetween, for example, the sheet acting as a releasing material may be put between the sintered body and the metal container when the body is sealed up in the container. The powdery releasing material may be previously applied onto the surface of the sintered body, before the body is sealed up in the container. Apart from those, any other means are employable for setting the releasing material in the container. In any case, it is desirable that the roughness of the surface of the releasing material that may be kept in direct contact with the sintered body as well as that of the inner surface of the metal container is minimized as much as possible in order to ensure uniform contact between the surface of the releasing material or the metal container and the sintered body being heat-treated and even to minimize the surface roughness of the heat-treated body.

It is desirable that the shape of the metal container in which the sintered body is sealed up is analogous to that of the sintered body. If needed, a releasing material is previously applied to the sintered body, which is then put into a metal container and sealed up therein (method 1). Alternatively, a metal container capable of easily deforming even at room temperature is used, and the sintered body is sealed up therein (method 2). Without being limited to those, any method is employable by which the sintered body can be airtightly sealed up in a metal container. One embodiment of the method of sealing up the sintered body in a metal container while degassing the container to be in vacuum is preferred, since its production efficiency is high, and since the oxidation of the heat treatment system is prevented therein. Where the sintered body is sealed up in the metal container in vacuum, it is desirable that the container is degassed to have a vacuum of $5 \times 10^{-1}$ Torr or less and thereafter the sintered body is sealed up in the container in vacuum. FIG. 1 is a cross-sectional view graphically showing the vacuum sealing of a sintered body in a metal container. In FIG. 1, 1 indicates an Al—SiC-based sintered body, which is surrounded by a releasing material 2. A metal container 3 is airtightly fitted around the releasing material 2. A degassing hole 4 is formed at the top of the metal container. Before the sintered body is sealed up in the metal container, the metal container is degassed through the hole so that it is airtightly fitted to the sintered body via the releasing material. After this, the hole is closed to give a sealed body. The object of the vacuum sealing is to prevent the oxidation of the sintered body, as so mentioned hereinabove. Therefore, if the releasing material is improved to meet the requirement of preventing the oxidation, it is not always necessary to seal up the sintered body in the metal container in vacuum so as to ensure airtight fitting of the container to the body to attain the intended object. One example of the method is to fill a material not reacting with the sintered body and with the metal container at the treating temperature but capable of easily absorbing or adsorbing oxygen gas, into the space between the sintered body and the metal container. The material to be used for the filling includes, for example, an easily oxidizable metal such as Ti, and an adsorbent such as fine alumina powder.

Next, the sealed body is compressed, while being heated at a temperature not lower than 700° C. For this treatment, it is desirable that the uppermost limit of the treating temperature is 900° C. If the treating temperature is higher than 900° C., the metal container will be easily deformed. If so, in addition, the container will react with the sintered body so that the heat-treated body will be difficult to release from the container. Though depending on the shape and the wall thickness of the metal container used and also on the mechanical strength of the container being deformed, the pressure for the treatment is preferably at least 100 atm. If the pressure is lower than 100 atm, it will be unevenly applied to the sintered body, depending on the rigidity level of the metal container. For the pressure heat treatment, employable are various systems of, for example, continuous hot pressing, monoaxial hot pressing, etc. Above all, preferred is HIP for it. According to HIP, obtained are members of which the dimension is nearly the same as the net shape of the sintered body, even though molds corresponding to the intended final shape of the members are not prepared.

Still another embodiment of the method of the invention is a so-called, hot forging method, which comprises preheating the sintered body having been prepared according to the process mentioned below, at a temperature not lower than 600° C., without the body being sealed up in a metal container, followed by subjecting it to pressure heat treatment in a mold. In this, the pre-heating is preferably conducted in a non-oxidizing atmosphere although it may be conducted in air. The pre-heating temperature is 600° C. or higher. This is in order to soften the component of Al or the Al alloy in the body to thereby make the heated body have a highly-densified, sound structure. For the pre-heating, the highest temperature is not limited. However, if heated at too high temperatures, Al or the Al alloy in the sintered body will melt and the body will be too much deformed. If so, the intended dimension accuracy could not be attained. In addition, the forged body will fuse with the mold. For these reasons, in general, the uppermost temperature for the pre-treatment is desirably 800° C. As the material for the mold for the hot forging, preferred are heat-resistant materials with high toughness and high hardness, such as cemented carbide (hard metal) or cermet, as well as heat-resistant, alloy tool steel materials such as SKD61 as stipulated in JIS. In order to prevent the melt from flowing out of the mold, it is desirable that the clearance between the punch and the die is as small as possible.

In the hot forging method, the sintered body to be forged may be continuously fed into the forging device. If desired, the forging step may be combined with the previous sintering step in a continuous line. Therefore, the hot forging method is relatively economical, as compared with the HIP method mentioned above. If desired, the compact may be directly hot-forged, without being previously sintered in nitrogen gas. However, the compact is easily cracked or damaged while it is transferred and set for forging. In addition, sufficient densification cannot be easily achieved through direct hot-forging. Therefore, it is desirable to forge the sintered body. The pressure for the hot forging is preferably at least 2 tons/cm$^2$. If the pressure is lower than 2 tons/cm$^2$, the densification could not be satisfactorily effected, and the intended thermal conductivity could not be obtained.

During the pressure heat treatment (HIP or hot forging), the component of Al or the Al alloy in the sintered body is softened or melted. However, as so mentioned hereinabove, the component does neither bleed out nor segregate in the surface of the heat-treated body. As a result of the heat treatment, the inner composition of the sintered body is much unified and further densified. In particular, for hardly sinterable bodies having a large SiC content or for large-sized members that require long-time sintering, such as those mentioned hereinabove, the pressure heat treatment is preferred for efficient production of high-quality members. Even though the pressure heat treatment is accompanied by liquid-phase sintering under external pressure, the heat-treated bodies are prevented from being warped or deformed.

As has been so mentioned hereinabove, the member obtained according to the method of the invention has a larger nitrogen content in its surface than in its inside area. In the member, the composition of the constituent components is uniform both in the surface and in the inside area. In addition, since the member has a net shape, it may be directly used as a substrate or the like for semiconductor devices, without requiring any heavy finishing through cutting or polishing.

If desired, the member of the invention may be lightly finished at its outer periphery through sand-blasting or barrel-finishing to have a finished outermost surface. In the finished member, some component grains will drop off at its corners, or minor rounds will adhere thereto. As the case may be, the finished outermost surface of the member will have fine depressions or hills formed thereon in such a degree that it has a surface roughness Ra of at most 2 μm. Even though its surface is not worked almost at all, the member of the invention has good platability. According to the invention, it is possible to stably obtain members having a high thermal conductivity of at least 200 W/m·K. Some of them, for example, having an SiC content of at least 60% by weight have, besides such high thermal conductivity, a low thermal expansion coefficient of at most $10 \times 10^{-6}$/°C. Using the members makes it possible to provide high-performance semiconductor devices.

EXAMPLE 1

Aluminum (Al) powder having a mean grain size of 25 μm and silicon carbide (SiC) powder having a mean grain size of 50 μm were weighed, as in Table 1, and blended in a kneader for 1 hour to give Al—SiC-based mixed powders having an SiC content of from 8 to 72% by weight. Apart from those, also prepared were mixed powders, for which, however, 2% by weight of Si, Ti, Nb, Cr, Mn, Ni or B was added to the Al powder and the mixed Al powder was used in place of the Al powder alone (Samples Nos. 12 to 18, respectively, in Table 1 below). While mixing them, an organic binder of PVA (polyvinyl alcohol) was added thereto in an amount of 5% by weight, relative to 100% by weight of the mixed powder, along with a minor amount of a plasticizer, and these were dispersed in the mixed powder. The resulting raw material slurry was spray-dried, using a spray drier, and granulated into spherical granules with good fluidity. The granulated powder was compacted, through dry powder pressing under a pressure of 7 tons/cm², into tablets having a diameter of 30 mm and a height of 5 mm. 30 tablets were formed from each powder sample. Apart from those, 30 tablets were also formed from each powder sample, for which the compacting pressure was about 2 tons/cm². However, some tablets produced under a compacting pressure of lower than 2 tons/cm² were cracked to have minor cracks at their corners or scratched to have minor scratches in their surfaces, while they were set before sintering.

Next, the compacted samples were sintered in an atmosphere having an oxygen concentration of 10 ppm, a dew point of −60° C. and a nitrogen content of at least 99%, under the condition indicated in Table 1. These samples are Samples Nos. 1 to 18 in Table 1. Apart from those, compacts of Sample No. 9 were sintered under the following conditions to prepare other five samples. Precisely, two were sintered in an atmosphere having the same dew point and the same nitrogen content as those for Sample No. 9 but having a different oxygen concentration of 180 ppm or 220 ppm, at the same temperature at which Sample No. 9 was sintered. The former is referred to as Sample No. 9a, while the latter as Sample No. 9b. One other was sintered in an atmosphere having an oxygen concentration of 180 ppm, a dew point of −60° C. and a nitrogen content of 97%, at a temperature of 660° C. to prepare a comparative sample. This is referred to as Sample No. 9c. Still other two were sintered in an atmosphere having the same oxygen concentration and the same nitrogen content as those for Sample No. 9 but having a different dew point of −23° C. or −17° C., at the same temperature at which Sample No. 9 was sintered. The former is referred to as Sample No. 9d, while the latter as Sample No. 9e.

As a result, Samples Nos. 1 to 18 of the invention, and Samples Nos. 9a, 9b, 9d and 9e of the invention were free from warping and deformation that might be the bar to their application to members for semiconductor devices, and they were sintered while retaining the net shape and the smooth surface condition of the compacts. The surface roughness of their sintered surface fell between 0.8 and 1.2 μm in terms of Ra. Of the comparative samples, Sample No. 11 having an SiC content of 72% by weight and Sample No. 6 for which the sintering temperature was lower than 600° C. could not have a densified structure, or that is, they were sintered poorly. It was found that Sample No. 8 that had been sintered at a temperature higher than the melting point of Al had small Al stains on its surface onto which Al had bled out. All samples were checked for their outward appearance, but no cracks were found at their corners and they were not damaged at all. However, the comparative Sample No. 9c had small Al stains on its surface onto which Al partly had bled out. Therefore, Sample No. 9c required cutting for surface finishing. Next, five test samples were sampled for each case and finished through simple sand-blasting, except for those of Sample No. 9c, and their thermal conductivity (at 20° C. and 100° C., according to a laser-flashing method) and their thermal expansion coefficient were measured. The data obtained are in Table 1, which are the average of the five test samples. The density of each sample was 89 to 99% in terms of relative density and pores remained. Herein, the relative density is the ratio(%) of the density value actually measured by Archimedes method to the theoretical density. The surface roughness of their finished surface fell between 0.9 and 1.4 μm in terms of Ra. It was confirmed through X-ray diffractometry that the samples of the invention had a small amount of an aluminum oxynitride (AlON) phase on their surface. Similarly, the inside area of the samples was examined but the phase was not detected. Test pieces of one mm cubes were cut out of each sample at its surface and in its center part, and melted in an inert gas, and the amount of nitrogen therein was measured according to a thermal conductivity method. From the data obtained, it was known that the amount of nitrogen in the surface part was larger than that in the center part in every sample. It was confirmed that the hardness of the alloys was, as shown by Samples Nos. 12 to 18, enhanced by using the Al powders including Si, Ti, Nb, Cr, Mn, Ni or B in an amount of 2% by weight in place of Al powder.

TABLE 1

| | | | | Characteristics of Sintered Bodies | | | |
|---|---|---|---|---|---|---|---|
| | Content of mixed SiC | Conditions for Sintering | | Thermal Conductivity (W/m · K) | | Thermal Expansion Coefficient | Density |
| No. | (wt. %) | Temp. (° C.) | Time (hr) | 20° C. | 100° C. | (× 10⁻⁶/° C.) | (g/cm³) |
| *1 | 8 | 650 | 2 | 238 | 155 | 21 | 2.70 |
| 2 | 10 | 650 | 2 | 235 | 153 | 19 | 2.71 |
| 3 | 20 | 650 | 2 | 230 | 158 | 17 | 2.75 |
| 4 | 30 | 650 | 2 | 225 | 157 | 16 | 2.79 |
| 5 | 40 | 650 | 2 | 220 | 155 | 14 | 2.79 |
| *6 | 50 | 550 | 2 | 46 | — | 18 | 2.75 |
| 7 | 50 | 650 | 2 | 208 | 153 | 13 | 2.77 |
| *8 | 50 | 670 | 2 | 203 | 148 | 13 | 2.76 |
| 9 | 60 | 650 | 2 | 192 | 142 | 10 | 2.76 |
| 10 | 70 | 650 | 2 | 190 | 130 | 8 | 2.73 |
| *11 | 72 | 650 | 2 | 88 | — | 11 | 2.65 |
| 12 | 70 | 650 | 2 | 190 | 130 | 8 | 2.70 |
| 13 | 70 | 650 | 2 | 182 | 124 | 8 | 2.69 |
| 14 | 70 | 650 | 2 | 185 | 126 | 8 | 2.69 |
| 15 | 70 | 650 | 2 | 181 | 120 | 8 | 2.68 |
| 16 | 70 | 650 | 2 | 178 | 118 | 8 | 2.68 |
| 17 | 70 | 650 | 2 | 176 | 118 | 8 | 2.68 |

TABLE 1-continued

| | | Conditions for Sintering | | Characteristics of Sintered Bodies | | | |
|---|---|---|---|---|---|---|---|
| | Content of mixed SIC | | | Thermal Conductivity (W/m · K) | | Thermal Expansion Coefficient | Density |
| No. | (wt. %) | Temp. (° C.) | Time (hr) | 20° C. | 100° C. | (× 10⁻⁶/° C.) | (g/cm³) |
| 18 | 70 | 650 | 2 | 175 | 116 | 8 | 2.67 |
| 9a | 60 | 650 | 2 | 190 | 140 | 10 | 2.75 |
| 9b | 60 | 650 | 2 | 185 | 126 | 10 | 2.75 |
| *9c | 60 | 660 | 2 | 180 | 120 | 10 | 2.74 |
| 9d | 60 | 650 | 2 | 190 | 140 | 10 | 2.74 |
| 9e | 60 | 650 | 2 | 188 | 136 | 10 | 2.74 |

Samples with "*" are comparative samples; and "—" indicates that the sample was not measured as the measurement was impossible.

Next, Samples Nos. 1 to 18 of the invention in Table 1, excepting the comparative samples were subjected to HIP treatment in the manner mentioned below. First, each sintered sample was entirely covered with a graphite sheet coating with a paste of boron nitride (BN) powder, and put into a metal container of a mild steel sheet having a thickness of 2 mm, as graphically shown in FIG. 1. Next, the container was degassed through the hole 4, as in FIG. 1, via a vacuum pump to have a vacuum degree of $10^{-3}$ Torr or less, whereby the sample was sealed up in the container in vacuum while being kept in airtight contact with the wall of the container. Next, the sample in the container was then subjected to pressure heat treatment through HIP under the condition indicated in Table 2. After having been thus treated, the sample was taken out of the container, and subjected to barrel-finishing to remove its outermost surface. The thermal conductivity and the thermal expansion coefficient of the HIP-treated samples were measured in the same manner as above. The data obtained are shown in Table 2. The surface roughness of all the barrel-finished samples fell between 0.8 and 1.3 μm in terms of Ra. The surface part and the inner part of each finished sample were checked in the same manner as set forth above for the phase formed therein, the amount of nitrogen therein and the amount of the main components therein. Their data were nearly the same as previously. The density of each sample was 96 to 100% in terms of relative density which was increased by the above pressure heat treatment. For Sample No. 28 in Table 2, both the metal container used and the treated body itself were slightly deformed.

TABLE 2

| | Number of Sintered Body in Table 1 | Conditions for Pressure Heat Treatment | | | Characteristics of Treated Body | | | |
|---|---|---|---|---|---|---|---|---|
| | | | | | Thermal Conductivity (W/m · K) | | Thermal Expansion Coefficient | Density |
| No. | | Temperature (° C.) | Pressure (atm) | Time (hr) | 20° C. | 100° C. | (× 10⁻⁶/° C.) | (g/cm³) |
| 19 | 2 | 750 | 100 | 1 | 246 | 162 | 21 | 2.72 |
| 20 | 3 | 750 | 100 | 1 | 235 | 159 | 17 | 2.76 |
| 21 | 4 | 750 | 100 | 1 | 230 | 160 | 16 | 2.81 |
| 22 | 7 | 750 | 100 | 1 | 215 | 155 | 13 | 2.88 |
| 23 | 9 | 750 | 100 | 1 | 210 | 152 | 10 | 2.89 |
| 24 | 10 | 750 | 100 | 1 | 205 | 155 | 8 | 2.92 |
| 25 | 10 | 690 | 100 | 1 | 195 | 150 | 8 | 2.90 |
| 26 | 10 | 800 | 100 | 1 | 208 | 152 | 8 | 2.93 |
| 27 | 10 | 900 | 100 | 1 | 206 | 153 | 8 | 2.93 |
| 28 | 10 | 910 | 100 | 1 | 204 | 152 | 8 | 2.93 |
| 29 | 10 | 750 | 90 | 1 | 200 | 157 | 8 | 2.90 |
| 30 | 10 | 750 | 500 | 1 | 207 | 152 | 8 | 2.92 |
| 31 | 10 | 750 | 1000 | 1 | 208 | 155 | 8 | 2.93 |
| 32 | 10 | 750 | 100 | 2 | 205 | 156 | 8 | 2.92 |
| 33 | 12 | 750 | 100 | 1 | 210 | 157 | 8 | 2.94 |
| 34 | 13 | 750 | 100 | 1 | 203 | 155 | 8 | 2.91 |
| 35 | 14 | 750 | 100 | 1 | 203 | 155 | 8 | 2.91 |
| 36 | 15 | 750 | 100 | 1 | 203 | 155 | 8 | 2.91 |
| 37 | 16 | 750 | 100 | 1 | 201 | 154 | 8 | 2.91 |
| 38 | 17 | 750 | 100 | 1 | 200 | 152 | 8 | 2.90 |
| 39 | 18 | 750 | 100 | 1 | 200 | 152 | 8 | 2.90 |

Next, Samples Nos. 1 to 18 of the invention in Table 1, excepting the comparative samples, were subjected to pressure heat treatment according to a hot forging method under the condition shown in Table 3. Prior to being forged, the samples were pre-heated in an atmosphere having an oxygen concentration of 10 ppm, a dew point of −60° C. and a nitrogen gas content of 99% or more. In this, the samples were pre-heated in an induction furnace, in which they were kept at the temperature indicated in Table 3 for a period of time also indicated in Table 3. The forging mold used herein was made of SKD61 and had a diameter of 31 mm. Prior to being used, the mold was pre-heated at 200° C., immediately the sintered sample to be forged was put thereinto, and hot-forged therein under the pressure indicated in Table 3. For Sample No. 60, the compact for Sample No. 10 was not sintered, but was pre-heated for a prolonged period of time and then directly hot-forged. These samples thus produced herein correspond to Samples Nos. 40 to 60 in Table 3.

The forged samples as above were subjected to barrel-finishing to remove their outermost surface, and their characteristics were evaluated in the same manner as in the previous Example. The data obtained are shown in Table 3. The surface roughness of all the barrel-finished samples fell between 0.8 and 1.3 μm in terms of Ra. The surface part and the inner part of each finished sample were checked in the same manner as set forth above for the aluminum oxynitride phase formed therein, the amount of nitrogen therein and the amount of the main components therein. Their data were nearly the same as previously. The density of each sample was 96 to 100% in terms of relative density and was increased by the above pressure heat treatment.

C. and have a thermal expansion coefficient of at most $10 \times 10^{-6}/°C$. It is also known that (3) in the composite alloys of the invention, a larger amount of nitrogen exists in the surface than in the inside area, just after they are sintered and even after they are post-treated for surface finishing. It is further known that (4) in the composite alloys of the invention, the main components do not segregate in the surface and in the inside area, and their composition is uniform throughout.

EXAMPLE 2

Figure 2:
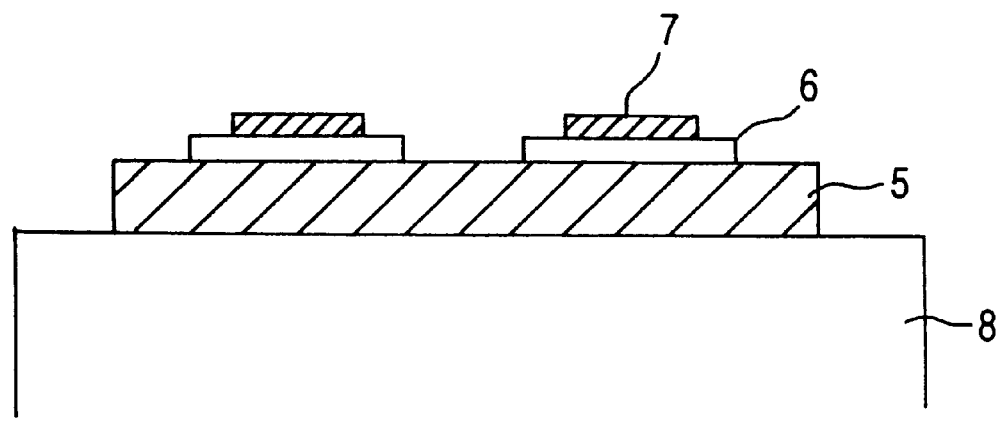
FIG. 2 is a graphic view showing one embodiment of the structure of a semiconductor device that comprises the member of the invention.

Members of the following types 1 and 2 were produced under the same production conditions as those for Samples 7, 10, 30, 33, 45 and 53 in Example 1, and finished through sand-blasting. Using these as a heat-radiating substrate, semiconductor units for power devices were packaged, as in FIG. 2 graphically showing the package structure, and subjected to a temperature cycle test. In FIG. 2, 5 indicates a second heat-radiating substrate comprising the Al—SiC-based composite alloy of the invention; 6 indicates a first heat-radiating substrate comprising an aluminum nitride ceramic, which is disposed on the substrate 5; 7 indicates an Si semiconductor chip; and 8 indicates a heat-radiation

TABLE 3

| | | Conditions for Forging | | | Characteristics of Treated Body | | | |
|---|---|---|---|---|---|---|---|---|
| | Number of Sintered | Conditions for Pre-Heating | | Forging | Thermal Conductivity | | Thermal Expansion | |
| | Body in | Temperature | Time | Pressure | (W/m · K) | | Coefficient | Density |
| No. | Table 1 | (° C.) | (min) | (tons/cm²) | 20° C. | 100° C. | (× 10⁻⁶/° C.) | (g/cm³) |
| 40 | 2 | 700 | 5 | 8 | 245 | 165 | 21 | 2.72 |
| 41 | 3 | 700 | 5 | 8 | 233 | 160 | 17 | 2.76 |
| 42 | 4 | 700 | 5 | 8 | 232 | 157 | 16 | 2.81 |
| 43 | 7 | 700 | 5 | 8 | 220 | 159 | 13 | 2.89 |
| 44 | 9 | 700 | 5 | 8 | 225 | 163 | 10 | 2.91 |
| 45 | 10 | 700 | 5 | 8 | 245 | 174 | 8 | 2.94 |
| 46 | 10 | 650 | 5 | 8 | 235 | 170 | 8 | 2.92 |
| *47 | 10 | 550 | 5 | 8 | 195 | 135 | 8 | 2.90 |
| 48 | 10 | 700 | 10 | 8 | 245 | 172 | 8 | 2.94 |
| 49 | 10 | 700 | 5 | 5 | 240 | 170 | 8 | 2.93 |
| 50 | 10 | 700 | 5 | 3 | 220 | 157 | 8 | 2.92 |
| 51 | 10 | 700 | 5 | 1 | 200 | 150 | 8 | 2.91 |
| 52 | 12 | 700 | 5 | 8 | 245 | 174 | 8 | 2.95 |
| 53 | 12 | 650 | 5 | 8 | 245 | 173 | 8 | 2.94 |
| 54 | 13 | 700 | 5 | 8 | 240 | 170 | 8 | 2.92 |
| 55 | 14 | 700 | 5 | 8 | 240 | 170 | 8 | 2.92 |
| 56 | 15 | 700 | 5 | 8 | 237 | 168 | 8 | 2.92 |
| 57 | 16 | 700 | 5 | 8 | 235 | 165 | 8 | 2.92 |
| 58 | 17 | 700 | 5 | 8 | 232 | 164 | 8 | 2.91 |
| 59 | 18 | 700 | 5 | 8 | 232 | 164 | 8 | 2.91 |
| 60 | 10 | 650 | 120 | 8 | 235 | 170 | 8 | 2.94 |

"*" indicates a comparative sample.

The following matters have been verified by the results as above. From the data in Table 1, it is known that (1) the primary sintering of the compacts having an SiC content of from 10 to 70% by weight gives sintered bodies having a thermal conductivity of at least 100 W/m·K and a thermal expansion coefficient of at most $20 \times 10^{-6}/°C$. From the data in Tables 2 and 3, it is known that (2) after sintering the pressure heat treatment (HIP) at a temperature of not lower than 700° C. of the sintered bodies having an SiC content of at least 60% by weight, which were sealed up in vacuum in a metal container, or the pressure heat treatment (hot-forging) of them in a mold at a temperature of not lower than 600° C. makes the bodies have a thermal conductivity of at least 200 W/m·K at 20° C. and at least 150 W/m·K at 100° structure disposed below the second heat-radiating substrate. (In this Example, the heat-radiation structure 8 is a water-cooling jacket. Apart from it, this may be an air-cooling, heat-radiating fin or the like.) In FIG. 2, other assemblies for peripheral wiring around the semiconductor chips and others are not shown. In Type 1 with two Si semiconductor chips being mounted thereon, needed is the composite alloy substrate of the invention having a size of 200 mm in length, 100 mm in width and 3 mm in thickness. In Type 2 with six chips being mounted thereon, needed is the substrate having a size of 300 mm in length, 200 mm in width and 3 mm in thickness. Accordingly, 50 substrate samples of each composite alloy of sample numbers noted above were produced for each of those two types in accordance with the production method of Example 1. Each sample was, prior to being sintered, holed to have prepared holes in the thickness direction at the four corners of its main surface, via which it is to be fitted to the water-cooling jacket. The holes had a diameter of about 2 mm, after the samples were sintered.

Direct soldering of the insulating substrate of AlN ceramic to the alloy substrates is impossible. Therefore, prior to being packaged, the alloy substrates of both Types 1 and 2 were finished in a simple manner as above, and then plated with an Ni—P plate layer having a mean thickness of 5 μm in an electroless plating manner, entirely on their main surface, and further with an Ni plate layer having a thickness of 2 μm in an electrolytic plating manner. A copper wire having a diameter of 1 mm was bonded to each of five samples randomly sampled from the Ni-plated samples for each of Types 1 and 2 of each sample number as set forth above, onto the plated surface in the direction vertical thereto, with a semi-spherical Pd—Sn-based solder having a diameter of 5 mm. Prior to this soldering, the surface of each sample was masked so as to prevent the solder from spreading over the other area except the spot at which the copper wire is to be bonded. The soldered copper wire was pulled up in the direction in which it was soldered on the surface of the sample. In this test, it was verified that the adhesion strength between the solder and every sample was at least 1 kg/mm$^2$, which is on the practicable level. Other 15 samples randomly sampled from the plated samples for each of Types 1 and 2 of each sample number as set forth above that had been plated were subjected a heat cycle test, for which one heat cycle comprises keeping each sample at −60° C. for 30 minutes and then keeping it at 150° C. for 30 minutes. In the test, each sample was exposed to 1000 heat cycles. After the test, the adhesion strength between the solder layer and each sample was measured in the same manner as above. All substrate prepared from the above members retained almost the same adhesion strength levels as those before the test.

Next, the first substrate of AlN ceramic having a thermal conductivity of 150 W/m·K was fitted to the surface of the Ni plate of each of the remaining second substrate samples of composite alloy, with a Pd—Sn-based solder. For this, masking the second substrate is needed so as to prevent the solder from spreading away to the area not needed for the same reason as above, since the second substrate was plated with Ni on its entire surface. However, for the masking, time-consuming labor is needed. Therefore, in this Example, the second substrate was plated with an Au plate layer having a thickness of 1 μm only in the area in which the first substrate 7 was fitted thereto and then heated at 400° C. in air so as to oxidize the surface area plated with Ni but not plated with Au. Next, the first substrate was fitted to the second substrate via the Au plate layer, with a Pd—Sn-based solder. 15 random samples in that condition were subjected to the same heat cycle test as above. In the test, found were no defects including cracks that might be formed by the heat for soldering, in the soldered area between the first substrate and the second substrate and in the interface between the second substrate and the Ni plate layer. After the test, the adhesion strength of each sample in the soldered area was measured in the same manner as previously. In every sample, the adhesion strength did not lower after the test, as compared with the original adhesion strength before the test. From those data obtained herein, it is known that, when an insulating first substrate of such an AlN ceramic or the like is soldered on the second substrate of the composite alloy of the invention, it is desirable to first plate the composite alloy substrate with Ni and thereafter to plate it with oxidation-resistant Au, Ag or the like only in the necessary area. The first substrate may be soldered onto the thus-plated second substrate.

In the manner mentioned above, the AlN ceramic substrate was soldered onto the double-plated second substrate. A carbon dioxide gas laser was applied to the part, in which the prepared holes had been formed, of the second substrate so that via-holes having a diameter of 3 mm were formed. Via those holes, the assembly will be fitted to a cooling jacket. The working for finishing the via-holes was attained at a higher speed and with higher accuracy than that for forming via-holes through Cu—W or Cu—Mo alloys for second substrates. This indicates the superiority of the composite alloy substrates of the invention over such conventional alloy substrates. On the AlN ceramic substrate of the thus-constructed substrate assembly, Si semiconductor chips were soldered, and finally, the assembly was fitted to a water-cooling jacket to construct a semiconductor device. This was subjected to the heat cycle test under the same condition as above. In the test, all samples tested were good in the soldered area and with respect to the operation characteristics including semiconductor power, etc.

As has been mentioned hereinabove, the substrate of the invention is lightweight and has high thermal conductivity. In particular, it well matches with other members for semiconductor devices, such as ceramics and others having a low thermal expansion coefficient, as it also has a low thermal expansion coefficient. In addition, its adhesiveness to various surface-treating layers such as Ni plates is good. Therefore, the substrate has good thermal shock resistance. Moreover, since the substrate well keeps the net shape in the sintered condition, its dimension may be all the time the desired one even though the sintered substrate is not finished through heavy machining for cutting or polishing. Therefore, the practical applicability of the substrate of the invention to inexpensive and high-performance members for semiconductor devices, especially to those for high-power devices is great over that of conventional substrates.

What is claimed is:

1. A member for semiconductor devices comprising a composite alloy of aluminum or an aluminum alloy and silicon carbide, wherein silicon carbide grains are dispersed in aluminum or the aluminum alloy in an amount of from 10 to 70% by weight, the amount of nitrogen in the surface of said member is larger than that in the inside thereof, and the ratio of aluminum or the aluminum alloy to silicon carbide is the same in the surface and the inside, wherein neither the aluminum nor aluminum alloy contains magnesium as an intentional addition.

2. The member for semiconductor devices as claimed in claim 1, wherein said aluminum alloy contains at least one element selected from the group consisting of elements of Groups 4a, 5a, 6a, 7a, 8, 3b and 4b.

3. The member for semiconductor devices as claimed in claim 1, of which the surface has a surface roughness Ra of at most 2 μm.

4. The member for semiconductor devices as claimed in claim 1, wherein the amount of said silicon carbide grains dispersed is at least 60% by weight, and the composite alloy has a thermal expansion coefficient of at most 10×10$^{-6}$/°C. and a thermal conductivity of at least 200 W/m·K.

5. The member for semiconductor devices as claimed in claim 4, which has a thermal conductivity of at least 150 W/m·K at a temperature of 100° C. or higher.

6. A semiconductor device comprising a member for semiconductor devices of claim 1.

* * * * *